(12) United States Patent
Yan et al.

(10) Patent No.: US 8,664,709 B2
(45) Date of Patent: Mar. 4, 2014

(54) NON-VOLATILE MEMORY AND FABRICATING METHOD THEREOF

(75) Inventors: Shih-Guei Yan, Hsinchu (TW);
Wen-Jer Tsai, Hsinchu (TW);
Jyun-Siang Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 591 days.

(21) Appl. No.: 12/839,559

(22) Filed: Jul. 20, 2010

(65) Prior Publication Data
US 2012/0018790 A1   Jan. 26, 2012

(51) Int. Cl.
*H01L 29/788* (2006.01)
(52) U.S. Cl.
USPC ............... 257/315; 257/E21.64; 257/E21.626
(58) Field of Classification Search
USPC ............................ 257/900, E21.626, E21.64
See application file for complete search history.

(56) References Cited

U.S. PATENT DOCUMENTS

| 6,207,515 B1 | 3/2001 | Hsieh et al. |
| 7,572,691 B2 | 8/2009 | Chen et al. |
| 2007/0057317 A1* | 3/2007 | Weng et al. ............... 257/324 |
| 2007/0235801 A1* | 10/2007 | Cheng et al. ............. 257/330 |
| 2008/0032476 A1* | 2/2008 | Huang et al. ............. 438/259 |

FOREIGN PATENT DOCUMENTS

| TW | 355835 | 4/1999 |
| TW | 200903734 | 1/2009 |

OTHER PUBLICATIONS

"Office Action of Taiwan Counterpart Application", issued on Mar. 22, 2013, p. 1-p. 7.

* cited by examiner

*Primary Examiner* — Julio J Maldonado
*Assistant Examiner* — Hajar Kolahdouzan
(74) *Attorney, Agent, or Firm* — J.C. Patents

(57) ABSTRACT

A non-volatile memory including a substrate, a stacked gate structure, two doped regions and a plurality of spacers is provided. The stacked gate structure is disposed on the substrate, wherein the stacked gate structure includes a first dielectric layer, a charge storage layer, a second dielectric layer and a conductive layer in sequence from bottom to top relative to the substrate. The doped regions are disposed in the substrate at two sides of the stacked gate structure, respectively, and bottom portions of the doped regions contact with the substrate under the doped regions. The spacers are respectively disposed between each side of each of the doped regions and the substrate, and top portions of the spacers are lower than top portions of the doped regions.

21 Claims, 5 Drawing Sheets

NON-VOLATILE MEMORY AND FABRICATING METHOD THEREOF

BACKGROUND

1. Field of the Invention

The present invention relates to a memory and a fabricating method thereof. More particularly, the present invention relates to a non-volatile memory and a fabricating method thereof.

2. Description of Related Art

A memory is a semiconductor device designed for storing information or data. As functions of a computer microprocessor become stronger, programs and computations executed by software are increased. Therefore, a capacity of the memory is required to be increased. In various memory products, a non-volatile memory, for example, an electrically erasable programmable read only memory (EEPROM) allows multiple data program, read and erase operations, and data stored therein can still be preserved even if the memory is powered off Based on the above advantages, the EEPROM is widely applied in personal computers and electronic equipments.

However, as a size of the EEPROM is gradually decreased, when a selected memory cell is programmed, an effect that secondary electrons influence an adjacent memory cell is aggravated.

SUMMARY

An embodiment of the present invention is directed to a non-volatile memory, which can effectively prevent an interference effect of secondary electrons generated during a programming operation.

An embodiment of the present invention is directed to a non-volatile memory, which can suppress a punch-through phenomenon and a short channel effect.

An embodiment of the present invention is directed to a method for fabricating a non-volatile memory, which can be easily integrated to a current fabrication process.

An embodiment of the present invention provides a non-volatile memory including a substrate, a stacked gate structure, two doped regions and a plurality of spacers. The stacked gate structure is disposed on the substrate, wherein the stacked gate structure includes a first dielectric layer, a charge storage layer, a second dielectric layer and a conductive layer in sequence from bottom to top relative to the substrate. The doped regions are respectively disposed in the substrate at two sides of the stacked gate structure, and bottom portions of the doped regions contact with the substrate under the doped regions. The spacers are respectively disposed between each side of each of the doped regions and the substrate, and top portions of the spacers are lower than top portions of the doped regions.

In an embodiment of the present invention, in the non-volatile memory, the charge storage layer is, for example, a charge trapping layer or a floating gate layer.

In an embodiment of the present invention, in the non-volatile memory, a material of the charge trapping layer is, for example, silicon nitride.

In an embodiment of the present invention, in the non-volatile memory, a material of the floating gate layer is, for example, doped polysilicon.

In an embodiment of the present invention, in the non-volatile memory, a material of the spacers is, for example, a dielectric material.

An embodiment of the present invention provides another non-volatile memory including a substrate, a stacked gate structure, a semiconductor layer, two doped regions and a plurality of spacers. The substrate includes two openings. The stacked gate structure is disposed on the substrate between the openings, wherein the stacked gate structure includes a first dielectric layer, a charge storage layer, a second dielectric layer and a conductive layer in sequence from bottom to top relative to the substrate. The semiconductor layer is disposed in the openings and fills the openings, and a bottom portion of the semiconductor layer contacts with the substrate under the semiconductor layer. The doped regions are respectively disposed in the semiconductor layer at two sides of the stacked gate structure. The spacers are respectively disposed between each side of each of the doped regions and the substrate, and top portions of the spacers are lower than top portions of the doped regions.

In another embodiment of the present invention, in the non-volatile memory, the charge storage layer is, for example, a charge trapping layer or a floating gate layer.

In another embodiment of the present invention, in the non-volatile memory, a material of the charge trapping layer is, for example, silicon nitride.

In another embodiment of the present invention, in the non-volatile memory, a material of the floating gate layer is, for example, doped polysilicon.

In another embodiment of the present invention, in the non-volatile memory, the semiconductor layer is extensionally disposed between the stacked gate structure and the substrate.

In another embodiment of the present invention, in the non-volatile memory, a material of the semiconductor layer is, for example, amorphous silicon, polysilicon, epitaxial silicon or silicon germanium.

In another embodiment of the present invention, in the non-volatile memory, a material of the spacers is, for example, a dielectric material.

In another embodiment of the present invention, in the non-volatile memory, a material of the semiconductor layer is different from that of the substrate.

An embodiment of the present invention provides a method for fabricating a non-volatile memory. The method includes following steps. Two openings are formed in a substrate. A spacer is formed on each sidewall of the openings. A semiconductor layer is formed in the openings to fill the openings, and a bottom portion of the semiconductor layer contacts with the substrate under the semiconductor layer. A stacked gate structure is formed on the substrate between the openings, wherein the stacked gate structure includes a first dielectric layer, a charge storage layer, a second dielectric layer and a conductive layer in sequence from bottom to top relative to the substrate. Doped regions are respectively formed in the semiconductor layer at two sides of the stacked gate structure, and top portions of the spacers are lower than top portions of the doped regions.

In an embodiment of the present invention, in the method for fabricating the non-volatile memory, a material of the semiconductor layer is different from that of the substrate.

In an embodiment of the present invention, in the method for fabricating the non-volatile memory, a material of the semiconductor layer is, for example, amorphous silicon, polysilicon, epitaxial silicon or silicon germanium.

In an embodiment of the present invention, in the method for fabricating the non-volatile memory, a method of forming the spacers is as follows. A spacer material layer is conformally formed on the substrate. A portion of the spacer material layer on a top surface of the substrate and on bottom surfaces of the openings is removed.

In an embodiment of the present invention, in the method for fabricating the non-volatile memory, the top portions of the spacers could be lower than the top portions of the openings of the substrate, so that the semiconductor layer could be merely filled in the openings of the substrate. Furthermore, the height of the top portions of the spacers could be equal to that of the top portions of the openings of the substrate, so that the semiconductor layer further includes being extensionally formed between the stacked gate structure and the substrate and entirely cover the spacers.

In an embodiment of the present invention, in the method for fabricating the non-volatile memory, a method of forming the semiconductor layer is, for example, a chemical vapor deposition method or an epitaxial growth method.

In an embodiment of the present invention, in the method for fabricating the non-volatile memory, a method of forming the stacked gate structure includes following steps. A first dielectric material layer, a charge storage material layer, a second dielectric material layer and a conductive material layer are formed on the substrate in sequence from bottom to top. A patterning process is performed to the first dielectric material layer, the charge storage material layer, the second dielectric material layer and the conductive material layer.

In an embodiment of the present invention, in the method for fabricating the non-volatile memory, the charge storage layer is, for example, a charge trapping layer or a floating gate layer.

According to the above descriptions, in the non-volatile memory of the embodiments of the present invention, since the spacers are disposed between each side of each of the doped regions and the substrate, a punch-through phenomenon and a short channel effect between the doped regions are prevented.

Moreover, in the non-volatile memory of the embodiments of the present invention, since the spacers are disposed between each side of each of the doped regions and the substrate, the doped regions having deeper depths can be fabricated, so that when a selected memory cell is programmed, a path of for injecting secondary electrons to an adjacent memory cell is prolonged, so as to suppress an interference effect of the secondary electrons during the programming operation.

Moreover, since none dielectric material is blocked between the doped regions and the substrate, when the secondary electrons pass through underneath of the doped regions, the secondary electrons are drained by the doped regions, so as to avoid an interference phenomenon of the secondary electrons during the programming operation.

On the other hand, the method for fabricating the non-volatile memory of the embodiments of the present invention can be easily integrated to a current fabrication process.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
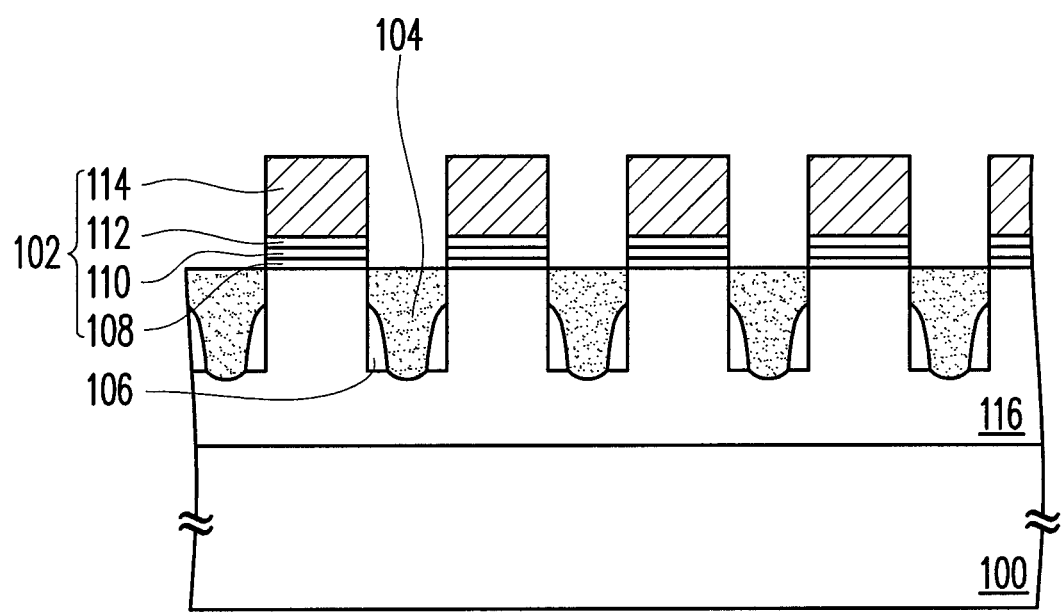
FIG. 1 is a cross-sectional view of a non-volatile memory according to an embodiment of the present invention.

FIG. 1 is a cross-sectional view of a non-volatile memory according to an embodiment of the present invention.

Referring to FIG. 1, the non-volatile memory includes a substrate 100, a stacked gate structure 102, two doped regions 104 and a plurality of spacers 106. The substrate 100 is, for example, a silicon substrate.

The stacked gate structure 102 is disposed on the substrate 100, wherein the stacked gate structure 102 includes a first dielectric layer 108, a charge storage layer 110, a second dielectric layer 112 and a conductive layer 114 in sequence from bottom to top relative to the substrate 100. A material of the first dielectric layer 108 is, for example, silicon oxide. The charge storage layer 110 is, for example, a charge trapping layer with a charge trapping material such as silicon nitride etc. or a floating gate layer with a material of doped polysilicon, etc. A material of the second dielectric layer 112 is, for example, silicon oxide. A material of the conductive layer 114 is, for example, doped polysilicon.

The doped regions 104 are respectively disposed in the substrate 100 at two sides of the stacked gate structure 102, and bottom portions of the doped regions 104 contact with the substrate 100 under the doped regions 104. The doped regions 104 can be used as source regions and drain regions of the non-volatile memory.

The spacers 106 are disposed between each side of each of the doped regions 104 and the substrate 100, and top portions of the spacers 106 are lower than top portions of the doped regions 104. Moreover, the bottom portions of the doped regions 104 can be further lower than bottom portions of the spacers 106, so as to deepen depths of the doped regions 104. A material of the spacer 106 is, for example, a dielectric material, which is, for example, silicon oxide or silicon nitride, etc.

Moreover, the non-volatile memory can further include well regions 116. The well regions 116 are located in the substrate 100, and the doped regions 104 are located in the well regions 116. Wherein, the well region 116 and the doped region 104 have different doping types.

According to the above descriptions, since the spacers 106 are disposed between each side of each of the doped regions 104 and the substrate 100, a punch-through phenomenon and a short channel effect between the doped regions 104 are prevented.

Moreover, since the spacers 106 are relatively disposed between each side of each of the doped regions 104 and the substrate 100, the doped regions 104 having deeper depths can be fabricated, so that when a selected memory cell is programmed, a path of for injecting secondary electrons to an adjacent memory cell is prolonged, so as to suppress an interference effect of the secondary electrons during the programming operation.

Moreover, since none dielectric material is blocked between the doped regions 104 and the substrate 100, when the secondary electrons pass through underneath of the doped regions 104, the secondary electrons are drained by the doped regions 104, so as to avoid an interference phenomenon of the secondary electrons during the programming operation.

FIGS. 2A-2D are cross-sectional views illustrating a process of fabricating a non-volatile memory according to an embodiment of the present invention.

Figure 2A:
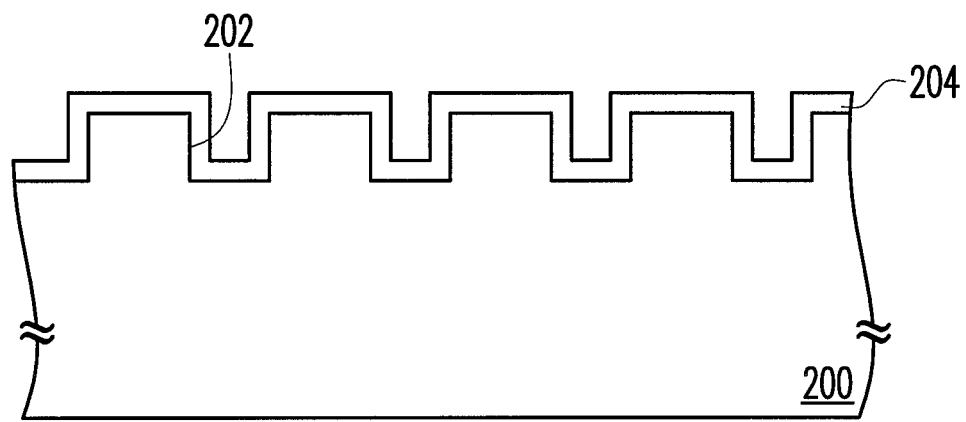
FIGS. 2A-2D are cross-sectional views illustrating a process of fabricating a non-volatile memory according to an embodiment of the present invention.

Referring to FIG. 2A, openings 202 are formed in a substrate 200. The substrate 200 is, for example, a silicon substrate. A method of forming the openings 202 includes performing a patterning process to the substrate 200.

A spacer material layer 204 is conformally formed on the substrate 200. A material of the spacer material layer 204 is, for example, a dielectric material, which is, for example, silicon oxide or silicon nitride, etc., and a method of forming the spacer material layer 204 is, for example, a chemical vapor deposition method.

Figure 2B:
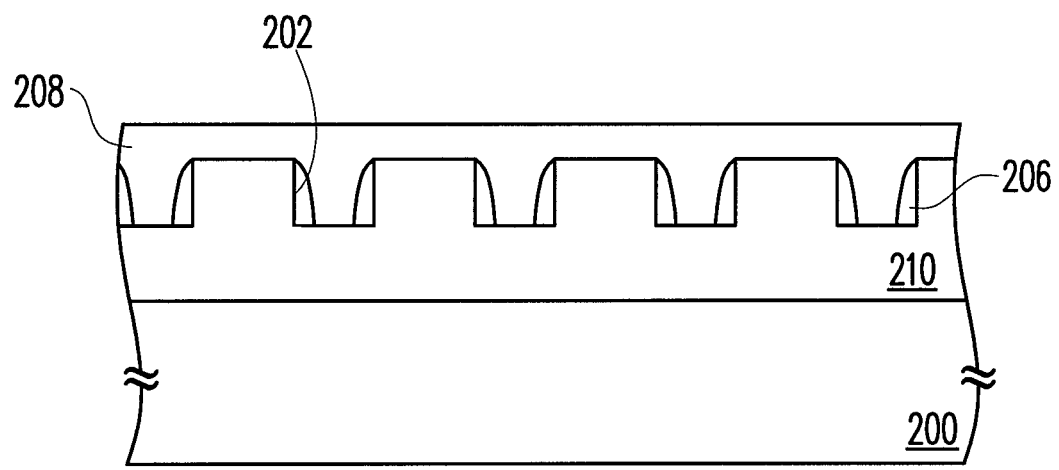

Referring to FIG. 2B, a portion of the spacer material layer 204 on a top surface of the substrate 200 and on bottom surfaces of the openings 202 is remove to form spacers 206 on each sidewall of the openings 202. The method of removing the portion of the spacer material layer 204 is performing an etch-back process to the spacer material layer 204, for example. However, a method of forming the spacers 206 is not limited to the above described method.

A semiconductor layer 208 is formed in the openings 202 to fill the openings 202, and a bottom portion of the semiconductor layer 208 contacts with the substrate 200 under the semiconductor layer 208. Moreover, the semiconductor layer 208 can be extensionally formed on the top surface of the substrate 200, selectively. In this embodiment, the height of the top portions of the spacers 206 could be equal to that of the top portions of the openings 202 of the substrate 200, so that the semiconductor layer 208 needs to be extensionally formed on the top surface of the substrate 200 and entirely covers the spacers 206. In another embodiment, the top portions of the spacers 206 could be lower than the top portions of the openings 202 of the substrate 200, so that the semiconductor layer 208 could be merely filled in the openings 202 of the substrate 200.

Furthermore, a material of the semiconductor layer 208 is different from that of the substrate 200. A material of the semiconductor layer 208 is, for example, amorphous silicon, polysilicon, epitaxial silicon or silicon germanium. If the material of the semiconductor layer 208 is amorphous silicon, polysilicon or silicon germanium, a method of forming the semiconductor layer 208 is, for example, a chemical vapor deposition method. If the material of the semiconductor layer 208 is epitaxial silicon, a method of forming the semiconductor layer 208 is, for example, an epitaxial growth method. Moreover, if the material of the semiconductor layer 208 is epitaxial silicon, an anneal process can be further performed to the semiconductor layer 208 to crystallize the material of the semiconductor layer 208.

Well regions 210 are selectively formed in the substrate 200 and the semiconductor layer 208. A method of forming the well regions 210 is, for example, an ion implantation method.

Figure 2C:
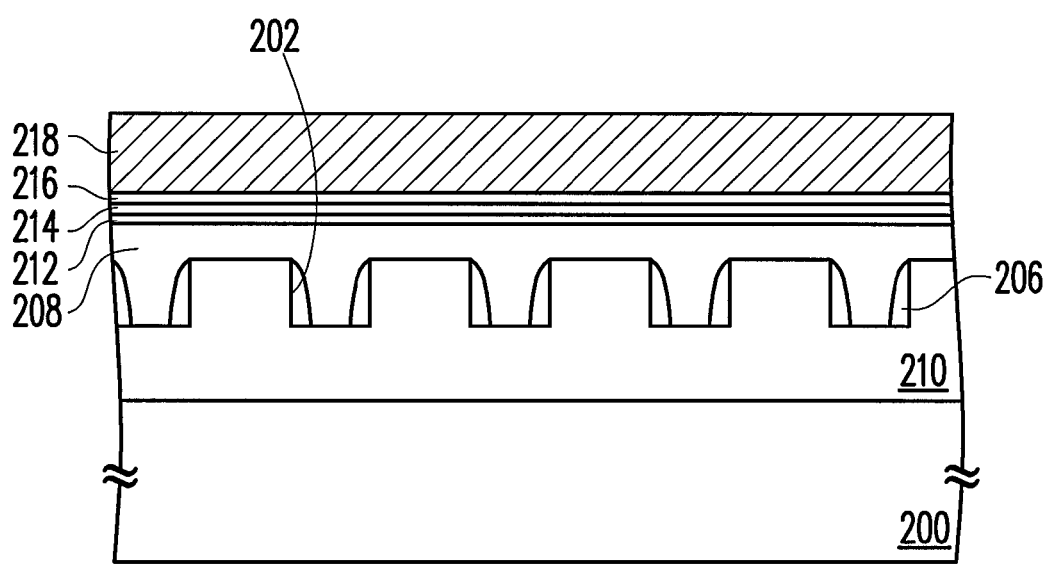

Referring to FIG. 2C, a first dielectric material layer 212, a charge storage material layer 214, a second dielectric material layer 216 and a conductive material layer 218 are sequentially formed on the semiconductor layer 208 from bottom to top. A material of the first dielectric material layer 212 is, for example, silicon oxide. The charge storage material layer 214 is, for example, a charge trapping layer with a charge trapping material such as silicon nitride etc. or a floating gate layer with a material of doped polysilicon, etc. A material of the second dielectric material layer 216 is, for example, silicon oxide. A material of the conductive material layer 218 is, for example, doped polysilicon. The first dielectric material layer 212, the charge storage material layer 214, the second dielectric material layer 216 and the conductive material layer 218 are, for example, respectively formed through a chemical vapor deposition method.

Figure 2D:
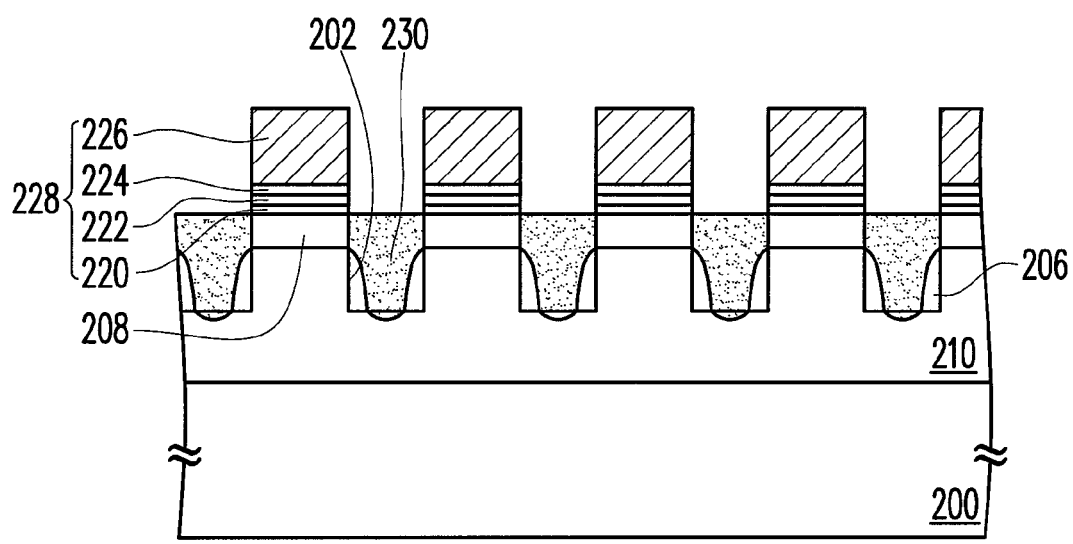

Referring to FIG. 2D, a patterning process is performed to the first dielectric material layer 212, the charge storage material layer 214, the second dielectric material layer 216 and the conductive material layer 218 to respectively form a first dielectric layer 220, a charge storage layer 222, a second dielectric layer 224 and a conductive layer 226, so as to form a stacked gate structure 228 on the semiconductor layer 208 above the substrate 200 between the openings 202. The stacked gate structure 228 includes the first dielectric layer 220, the charge storage layer 222, the second dielectric layer 224 and the conductive layer 226 in sequence from bottom to top relative to the substrate 200. However, the method of forming the stacked gate structure 228 is not limited to the above method.

Doped regions 230 are respectively formed in the semiconductor layer 208 at two sides of the stacked gate structure 228 by using the stacked gate structure 228 as a mask, for example, wherein top portions of the spacers 206 are lower than top portions of the doped regions 230. Moreover, the doped regions 230 can be extensionally formed in the substrate 200 under the semiconductor layer 208, so that the bottom portions of the doped regions 230 can be lower than bottom portions of the spacers 206, so as to deepen depths of the doped regions 230. The doped regions 230 can be used as source regions and drain regions of the non-volatile memory. The doped regions 230 and the well regions 210, for example, have different doping types. A method of forming the doped region 230 is, for example, an ion implantation method.

According to the above descriptions, it is known that the method for fabricating the non-volatile memory of the embodiment can be easily integrated to a current fabrication process.

The non-volatile memory of the present embodiment is described with reference of FIG. 2D.

Referring to FIG. 2D, the non-volatile memory includes the substrate 200, the stacked gate structure 228, the semiconductor layer 208, the doped regions 230 and the spacers 206. The substrate 200 includes the openings 202. The stacked gate structure 228 is disposed on the semiconductor layer 208 above the substrate 200 between the openings 202, wherein the stacked gate structure 228 includes the first dielectric layer 220, the charge storage layer 222, the second dielectric layer 224 and the conductive layer 226 in sequence from bottom to top relative to the substrate 200. The semiconductor layer 208 is disposed in the openings 202 and fills the openings 202, and can be extensionally disposed between the stacked gate structure 228 and the substrate 200. Wherein, a bottom portion of the semiconductor layer 208 contacts with the substrate 200 under the semiconductor layer 208. The doped regions 230 are respectively disposed in the substrate 208 at two sides of the stacked gate structure 228. The spacers 206 are respectively disposed between each side of each of the doped regions 230 and the substrate 200, and the top portions of the spacers 206 are lower than the top portions of the doped regions 230. Moreover, the non-volatile memory can further include well regions 210. The well regions 210 are located in the substrate 200 and the semiconductor layer 208, and the doped regions 230 are located in the well regions 210. Since materials, forming methods and configurations of various components of the non-volatile memory of FIG. 2D have been described in detail in the aforementioned embodiment, detailed descriptions thereof are not repeated.

According to the above descriptions, since the spacers 206 are disposed between each side of each of the doped regions 230 and the substrate 200, a punch-through phenomenon and a short channel effect between the doped regions 230 are prevented.

Moreover, since the spacers 206 are disposed between each side of each of the doped regions 230 and the substrate 200, depths of the doped regions 230 can be further deepened, so that when a selected memory cell is programmed, a path of for injecting secondary electrons to an adjacent memory cell is prolonged, so as to prevent the interference of the secondary electrons.

Moreover, since none dielectric material is blocked between the bottom portion of the doped regions 230 and the substrate 200, when the secondary electrons pass through underneath of the doped regions 230, the secondary electrons are drained by the doped regions 230, so as to avoid an interference phenomenon of the secondary electrons during the programming operation.

On the other hand, if the material of the semiconductor layer 208 is epitaxial silicon, since none dielectric material is blocked between the semiconductor layer 208 and the substrate 200, the semiconductor layer 208 with a better film quality is obtained.

In summary, the aforementioned embodiments has at least the following advantages:
1. The non-volatile memory of the aforementioned embodiments can suppress a punch-through phenomenon and a short channel effect between the doped regions.
2. The non-volatile memory of the aforementioned embodiments can prevent the interference of the secondary electrons during the programming operation.
3. The method for fabricating the non-volatile memory of the aforementioned embodiments can be easily integrated to a current fabrication process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
    a substrate;
    a stacked gate structure, disposed on the substrate, wherein the stacked gate structure comprises a first dielectric layer, a charge storage layer, a second dielectric layer and a conductive layer in sequence from bottom to top relative to the substrate;
    two doped regions, respectively disposed in the substrate at two sides of the stacked gate structure, and bottom portions of the doped regions contacting with the substrate under the doped regions; and
    a plurality of spacers, respectively disposed between each side of each of the doped regions and the substrate, and top portions of the spacers being lower than top portions of the doped regions.

2. The non-volatile memory as claimed in claim 1, wherein the charge storage layer comprises a charge trapping layer or a floating gate layer.

3. The non-volatile memory as claimed in claim 2, wherein a material of the charge trapping layer comprises silicon nitride.

4. The non-volatile memory as claimed in claim 2, wherein a material of the floating gate layer comprises doped polysilicon.

5. The non-volatile memory as claimed in claim 1, wherein a material of the spacers comprises a dielectric material.

6. A non-volatile memory comprising:
    a substrate, comprising two openings;
    a stacked gate structure, disposed on the substrate between the openings, wherein the stacked gate structure comprises a first dielectric layer, a charge storage layer, a second dielectric layer and a conductive layer in sequence from bottom to top relative to the substrate;
    a semiconductor layer, disposed in the openings and filling the openings, and a bottom portion of the semiconductor layer contacting with the substrate under the semiconductor layer;
    two doped regions, respectively disposed in the semiconductor layer at two sides of the stacked gate structure; and
    a plurality of spacers, respectively disposed between each side of each of the doped regions and the substrate, and top portions of the spacers being lower than top portions of the doped regions.

7. The non-volatile memory as claimed in claim 6, wherein the charge storage layer comprises a charge trapping layer or a floating gate layer.

8. The non-volatile memory as claimed in claim 7, wherein a material of the charge trapping layer comprises silicon nitride.

9. The non-volatile memory as claimed in claim 7, wherein a material of the floating gate layer comprises doped polysilicon.

10. The non-volatile memory as claimed in claim 6, wherein the semiconductor layer is extensionally disposed between the stacked gate structure and the substrate.

11. The non-volatile memory as claimed in claim 6, wherein a material of the semiconductor layer comprises amorphous silicon, polysilicon, epitaxial silicon or silicon germanium.

12. The non-volatile memory as claimed in claim 6, wherein a material of the spacers comprises a dielectric material.

13. The non-volatile memory as claimed in claim 6, wherein a material of the semiconductor layer is different from that of the substrate.

14. A method for fabricating a non-volatile memory, comprising:
    forming two openings in a substrate;
    forming a spacer on each sidewall of the openings;
    forming a semiconductor layer in the openings to fill the openings, wherein a bottom portion of the semiconductor layer contacts with the substrate under the semiconductor layer;
    forming a stacked gate structure on the substrate between the openings, wherein the stacked gate structure comprises a first dielectric layer, a charge storage layer, a second dielectric layer and a conductive layer in sequence from bottom to top relative to the substrate; and
    respectively forming doped regions in the semiconductor layer at two sides of the stacked gate structure, wherein top portions of the spacers are lower than top portions of the doped regions.

15. The method for fabricating the non-volatile memory as claimed in claim 14, wherein a material of the semiconductor layer is different from that of the substrate.

16. The method for fabricating the non-volatile memory as claimed in claim 14, wherein a material of the semiconductor layer comprises amorphous silicon, polysilicon, epitaxial silicon or silicon germanium.

17. The method for fabricating the non-volatile memory as claimed in claim 14, wherein a method of forming the spacers comprises:

conformally forming a spacer material layer on the substrate; and removing a portion of the spacer material layer on a top surface of the substrate and on bottom surfaces of the openings.

18. The method for fabricating the non-volatile memory as claimed in claim 14, wherein the semiconductor layer is extensionally formed between the stacked gate structure and the substrate.

19. The method for fabricating the non-volatile memory as claimed in claim 14, wherein a method of forming the semiconductor layer comprises a chemical vapor deposition method or an epitaxial growth method.

20. The method for fabricating the non-volatile memory as claimed in claim 14, wherein a method of forming the stacked gate structure comprises:

forming a first dielectric material layer, a charge storage material layer, a second dielectric material layer and a conductive material layer on the substrate in sequence from bottom to top; and performing a patterning process to the first dielectric material layer, the charge storage material layer, the second dielectric material layer and the conductive material layer.

21. The method for fabricating the non-volatile memory as claimed in claim 14, wherein the charge storage layer comprises a charge trapping layer or a floating gate layer.

* * * * *